United States Patent
Nakabayashi et al.

(10) Patent No.: US 9,548,261 B2
(45) Date of Patent: Jan. 17, 2017

(54) LEAD FRAME AND SEMICONDUCTOR DEVICE

(71) Applicant: NICHIA CORPORATION, Anan-shi, Tokushima (JP)

(72) Inventors: Takuya Nakabayashi, Tokushima (JP); Yoshitaka Bando, Anan (JP); Hiroto Tamaki, Anan (JP)

(73) Assignee: NICHIA CORPORATION, Anan-shi (JP)

(*) Notice: Subject to any disclaimer, the term of this patent is extended or adjusted under 35 U.S.C. 154(b) by 157 days.

(21) Appl. No.: 14/196,805

(22) Filed: Mar. 4, 2014

(65) Prior Publication Data

US 2014/0252582 A1 Sep. 11, 2014

(30) Foreign Application Priority Data

Mar. 5, 2013 (JP) ................... 2013-043559

(51) Int. Cl.
*H01L 23/495* (2006.01)
*H01L 33/62* (2010.01)

(52) U.S. Cl.
CPC .... *H01L 23/49503* (2013.01); *H01L 23/49562* (2013.01); *H01L 23/49582* (2013.01); *H01L 33/62* (2013.01); *H01L 2924/0002* (2013.01); *H01L 2933/0066* (2013.01)

(58) Field of Classification Search
CPC .............. H01L 2924/00; H01L 2924/00014; H01L 2224/73265; H01L 2224/48247; H01L 23/49503
See application file for complete search history.

(56) References Cited

U.S. PATENT DOCUMENTS

| 4,805,009 | A | * | 2/1989 | Pryor | ............... H01L 23/06 174/539 |
| 2005/0054141 | A1 | * | 3/2005 | Kim | ............... H01L 23/3107 438/111 |
| 2008/0290484 | A1 | * | 11/2008 | Low | ............... H01L 21/565 257/675 |
| 2009/0160036 | A1 | * | 6/2009 | Grey | ............... H01L 23/49503 257/666 |
| 2009/0258458 | A1 | * | 10/2009 | Zhang | ............... H01L 23/49562 438/107 |
| 2010/0163919 | A1 | * | 7/2010 | Kamamori | ............... H01L 33/483 257/99 |

(Continued)

*Primary Examiner* — Zandra Smith
*Assistant Examiner* — John M Parker
(74) *Attorney, Agent, or Firm* — Global IP Counselors, LLP

(57) ABSTRACT

A lead frame of high quality which can endure direct bonding to a semiconductor element, and a semiconductor device of high reliability which utilizing the lead frame. A lead frame includes a plurality of connected units, each unit including a pair of lead portions arranged spaced apart and opposite from each other, for mounting a semiconductor element and electrically connecting to a pair of electrodes of the semiconductor element respectively. The lead portions respectively include an element mounting region arranged on a surface thereof to mount the semiconductor element, and a groove extending from opposing end surfaces of each of the pair of lead portions, in a direction away from the end surfaces and bending in a surrounding manner along outer periphery of the element mounting region.

19 Claims, 10 Drawing Sheets

(56) References Cited

U.S. PATENT DOCUMENTS

| | | | | |
|---|---|---|---|---|
| 2010/0311208 A1* | 12/2010 | Sirinorakul | ......... | H01L 21/4832 438/113 |
| 2012/0164794 A1* | 6/2012 | Xue | ................... | H01L 23/4952 438/123 |
| 2014/0252401 A1* | 9/2014 | Nakabayashi | .......... | H01L 33/62 257/99 |
| 2014/0252574 A1* | 9/2014 | Nakabayashi | .... | H01L 23/49537 257/666 |

* cited by examiner

LEAD FRAME AND SEMICONDUCTOR DEVICE

CROSS-REFERENCE TO RELATED APPLICATION

This application claims priority to Japanese Patent Application No. 2013-043559, filed on Mar. 5, 2013. The entire disclosure of Japanese Patent Application No. 2013-043559 is hereby incorporated herein by reference.

BACKGROUND

1. Technical Field

The present disclosure relates to a light emitting device applicable to purposes such as an indicator, a lighting apparatus, a display, a backlight light source for liquid crystal display.

2. Background Art

In recent years, various electronic components have been proposed and are put in practical use, and increasingly high performance has been required on such components. In particular, electric components are required for maintaining performance for a long period of time even under severe environment. The same applies for semiconductor devices such as memory modules and light emitting diodes (LEDs). Requirements for higher performance in the area of general lighting, in-vehicle lighting, and the like, further higher output (higher luminance) and higher reliability are demanded. Accordingly, for example, JP H05-102386A proposes the use of a clad material having a stacked-layer structure formed by pressure bonding, for a lead frame material that has a high degree of hardness and a high electrical conductivity.

Also, depending on the usage of the semiconductor device, further reduction in size of the electric components while retaining the high performance has been demanded. Accordingly, various adjustments have been made in the structure of the package as well as in the structure of the semiconductor element. For example, in a semiconductor device which can be downsized, in order to obtain adhesion between the semiconductor element and a sealing resin and/or leads, JP2001-223391A, JP-2009-141030A, JPH11-288957A, and JP2011-159837A respectively propose to form an irregular texture on the surface of each lead which increases the surface area of the lead, or to from an irregular texture on the end surfaces opposite to the bonding member.

SUMMARY

The present invention is devised to solve the problems as described above, and an object of the present invention is to provide a lead frame of high quality which can endure direct bonding to an element, and to provide a semiconductor device of high reliability which utilizing the lead frame.

The embodiments include the aspects described below.

(1) A lead frame includes a plurality of connected units, each unit including a pair of lead portions arranged spaced apart and opposite from each other, for mounting a semiconductor element and electrically connecting to a pair of electrodes of the semiconductor element respectively. The lead portions respectively include an element mounting region arranged on a surface thereof to mount the semiconductor element, and a groove extending from opposing end surfaces of each of the pair of lead portions, in a direction away from the end surfaces and bending in a surrounding manner along outer periphery of the element mounting region.

(2) A semiconductor device includes a semiconductor element having a pair of electrode on a same surface side, a lead frame to be described in the embodiments below, and a resin member disposed at least between the lead portions which are arranged spaced apart and opposite from each other, to fix the lead frame and cover the groove defined in the lead frame.

According to the disclosure, a lead frame of high quality which can endure direct bonding to a semiconductor element can be provided. Also, with the use of the lead frame, a semiconductor device which enables further reduction in size and in thickness can be provided.

DETAILED DESCRIPTION

Figure 1A:
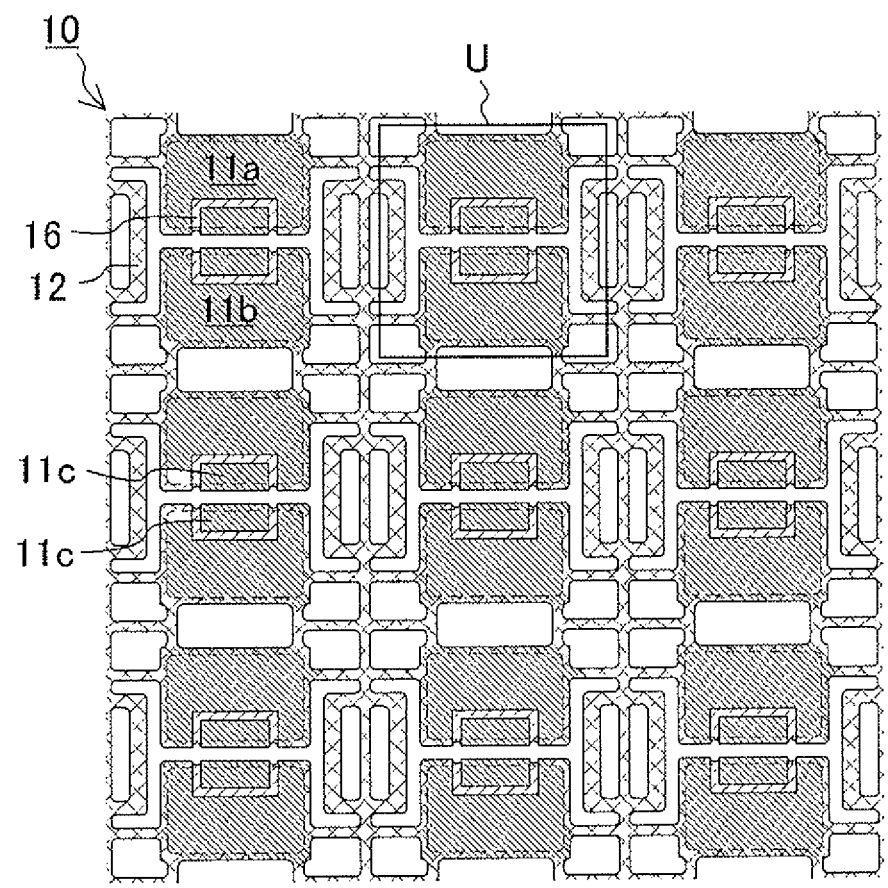
FIG. 1A is a plan view showing a lead frame in which a plurality of lead frame units according to Embodiment 1 are connected.

Embodiments of the lead frame and the semiconductor device according to the present invention will be described below with reference to the drawings. The sizes and the positional relationships of the members in each of drawings are occasionally shown exaggerated for ease of explanation. Further, in the description below, the same designations or the same reference numerals may, in principle, denote the same or like members and duplicative descriptions will be appropriately omitted.

Lead Frame

The lead frame according to the embodiments is a metal member and is constituted with a plurality of connected units connected with each other, each of which includes a pair of lead portions to serve as electrodes. Each unit generally has a frame at its outer periphery which is at a border of a unit in the pattern of units. At the time of singulating into the individual semiconductor devices, the lead frame is cut into the individual units. Now, one unit in the lead frame will be described below.

(Lead Portion)

A pair of lead portions are placed spaced apart and opposite from each other. That is, of the pair of lead portions, one lead portion is arranged to electrically bonded to one electrode of a pair of electrodes, to be described below, in the semiconductor element, and the other lead portion is electrically bonded to the other electrode of the semiconductor element, Thus, the pair of lead portions serve as at least a positive or a negative electrode terminal, respectively. In the embodiments, the term "lead portions" refers to the portions which are exposed from the resin member to be described below, and are electrically connected to the electrodes of a light emitting element respectively.

Accordingly, a pair of lead portions each has a region on its surface, and a pair of the regions together constitutes a region for mounting an element. Each of the regions for mounting the light emitting element (hereinafter may be referred to as "element mounting region") is demarcated by the groove to be described below. The term "element mounting regions" refer to the portions which together have a shape corresponding to outer circumferential shape of the semiconductor element and together have a planar dimension corresponding to the planar dimension of the semiconductor element. That is, the outer circumferential shape which includes a pair of semiconductor element mounting regions and a gap (a region where a resin member to be disposed in a later manufacturing step) between the pair of semiconductor element mounting regions, may be in conformity to, or approximately in conformity to, or slightly larger or slightly smaller (for example, an area ratio of within ±10%) than the outer circumferential shape of the semiconductor element to be arranged on the semiconductor element mounting regions. The number of semiconductor elements arranged on the element mounting region may either be one or two or more. In the latter case, the overall outermost circumferential shape of the arranged plurality of semiconductor elements as a whole can be regarded as the outer circumferential shape of the semiconductor element described above.

The planar dimensions of the lead portions and the element mounting region can be appropriately designed according to the planar dimensions, number, arrangement, or the like, of the semiconductor elements to be disposed thereon. The shape or location of the gap between the pair of element mounting regions can be appropriately designed according to the positive and negative electrodes for the element disposed on the semiconductor element.

The surfaces of the lead portions are preferably flat, but a lead frame material having a slight irregular texture, or irregularity or roughness on the surface can be used. Also, the irregularity or roughness of the surface of the lead frame material which forms a pattern which allows alternate arrangement of the lead frame material and the resin may be employed particularly in the element mounting region. For example, the surface of the element mounting region may have recesses which may together form a recess portion (inner groove) in a comb-like shape or a saw blade-like shape. Such a recess portion preferably has an end reaching the end surface between the pair of lead portions. With this arrangement, at the time of forming the resin member of the semiconductor device, the resin can be injected from the end surface between the lead portions, so that the inner portion of the groove can be covered with the resin. With this, alignment effect of the semiconductor elements can be sufficiently exerted. The lead portion preferably includes an inner groove in the groove, the inner groove substantially parallel to a side defining the groove. Moreover, the lead portion preferably includes a groove, the groove substantially parallel to a groove which is surrounding the element mounting region.

The back-surface of each lead portion may have a shape, such as an irregular shape, which is different from the surface of the lead portion. As shown in FIG. 1B, each of the element mounting regions 11C has a region of a smaller thickness (the portion shaded with cross-hatching) in a part of the lead portion. The region with a smaller thickness is a region processed by etching or pressing from the back-surface side of the lead portion so that the end portion on the back-surface side locates inner side than the end portion of the surface, which can be formed to occupy an area of about $\frac{1}{5}$ to 1 time with respect to the element mounting region.

Groove

The lead portion includes a groove surrounding the element mounting region in its upper surface, to demarcate the element mounting region, that is, to demarcate the region where the semiconductor element is mounted in a bridge manner on the pair of lead portions. The term "surrounding element mounting region" used herein refers to surround the all outer peripheral circumference of the element mounting region, and also refers to surround the portion corresponding to the all outer peripheral circumference of the element mounting region with two or more separate grooves. With the use of such regions, alignment of the semiconductor element to appropriate locations of the lead portions (particularly to the element mounting regions) can be efficiently performed, in order to bond the semiconductor element to the demarcated semiconductor element mounting regions with the bounding member respectively.

The grooves are respectively started at the end surfaces of the pair of lead portions and extended in a direction away from the end surfaces in conformity with the outer circumferential shape of the semiconductor element. The groove is thus started at the end surfaces, so that at the time of forming the resin member of the semiconductor device, the resin can be injected from the end surface side of the lead portions to apply the coating in the groove. With this, alignment effect of the semiconductor elements described above can be more efficiently exerted. In the specification, the term "extending in a direction away from" preferably refers to, for example, extending in a direction perpendicular or approximately perpendicular (±10°) to the edges of the lead portions determined by the end surfaces respectively. Also, the extending portions are preferably formed in a straight line shape.

The grooves are respectively bent from the extending parts so as to be in conformity with the periphery of the semiconductor element. That is, the grooves are extended and bent to provide the groove in a shape along the portion which is in conformity to the two peripheral sides of the semiconductor element. Accordingly, alignment effect to the designated locations can be securely attained. A degree of bending which can produce a corner is sufficient, and any corner with an obtuse angle to an acute angle can be employed, but a perpendicular or an approximately perpendicular bending is preferable.

Figure 6A:
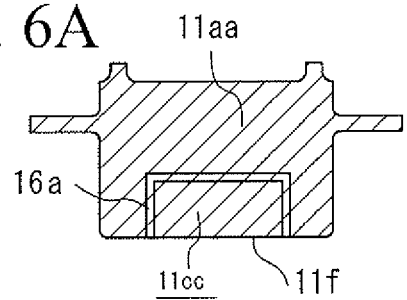
FIGS. 6A to 6J are plan views of a major portion for illustrating a shape of a groove defined in the lead frame, according to the embodiments of the present invention.
Figure 6F:
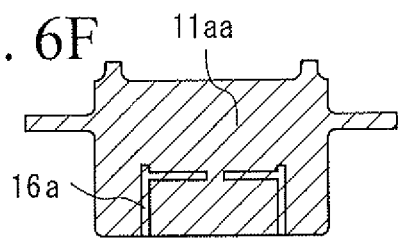
Figure 6B:
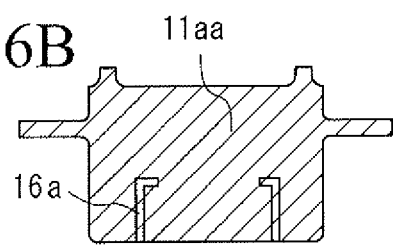
Figure 6G:
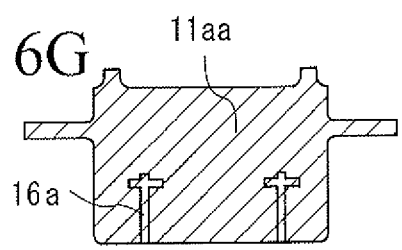
Figure 6C:
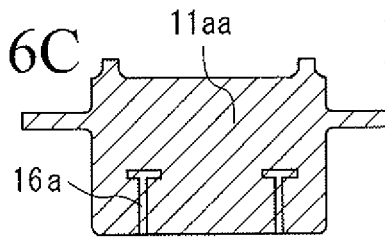
Figure 6H:
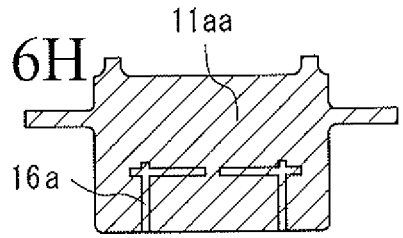
Figure 6D:
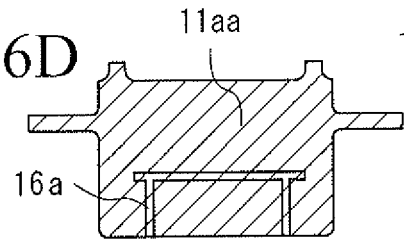
Figure 6I:
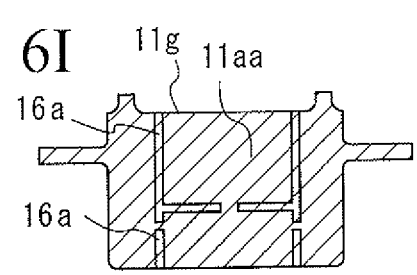
Figure 6E:
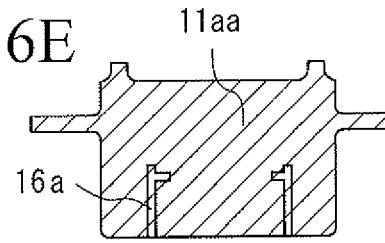
Figure 6J:
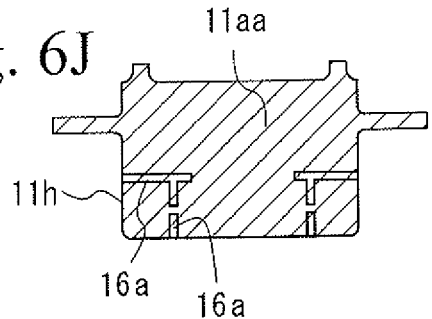

Examples of the simplest shape for the groove include, as seen in the groove 16a shown in FIG. 6A, a U-shape surrounding one element mounting region in one lead portion 11a. In this shape, the end portions of the groove 16a reach the end surface 11f between a pair of lead portions. For the groove, a groove 16a (FIG. 6B etc.) with an L-shaped portions, a groove 16a (FIGS. 6C, 6D, 6E, 6F, 6I, 6J) with a T-shaped portions, or a groove 16a (FIGS. 6G, 6H) with a cross-shape portions may be employed. In this case, the groove 16a is preferably arranged in two or more separate portions with respect to one element mounting portion (FIGS. 6B, 6C, 6E, 6F, 6G, 6H, 6I, 6J). In those shapes, the end portions of the groove 16a preferably reach the end surface (11f in FIG. 6A) between a pair of lead portions, the end surface (11g in FIG. 6I) of the lead portion 11aa at the opposite side from the end surface (11 if in FIG. 6A) between a pair of lead portions, or the end surface (11h in FIG. 6J) of the lead portion 11aa whose plane intersects the plane of the end surface (11f in FIG. 6A) between a pair of lead portions. With the shapes as described above, the surface of the grooves can be easily covered with the resin member to be described below. Accordingly, alignment effect to the appropriate location can be securely attained.

The grooves are needed to have a width to fill a melt resin at the time of forming a resin member, and a width of about 60 µm to 200 µm is preferable. If the width of the groove is too wide, the upper surface of the resin member which is filled in the groove tends to form a dent due to cure shrinkage of the resin member. Such a dent may results in undesirable mounting of the dice. If the width of the groove is too narrow, the resin can not be filled (short fill), particularly, the bending portions which are apart from the end surface of the lead may be difficult to fill, thus, undesirable. The depth of the groove is preferably similar to the width of the groove, and for example, about 60 µm to 200 µm is preferable. The cross-sectional shape of the groove may be a quadrangular shape, a triangular shape, a semicircular shape, or a shape which is a combination of these shapes may be employed. The groove is preferably formed with approximately uniform width, depth, and cross-sectional shape throughout its entire length, but is not limited by those, a different width, depth, and/or cross-sectional shape may also be applied to the portions respectively. However, the inner-side periphery of the groove (the periphery at the element mounting region side) is preferably formed in conformity to the outer periphery of the element. For this reason, in the case where the inner-side periphery of the groove (the periphery at the element mounting region side) is partially wider or narrower, the outer-side periphery of the groove is preferably altered with a curved shape, a step-difference, or a slanted surface.

In the case where a clad material is used for the lead frame, the groove can be defined, as seen in FIGS. 1D, 2A, 2B, 3, by various cross-sectional shapes each having an irregular side, with the use of a combination of the materials and the etchant. The groove is formed in conformity to the shape of the element, and providing the groove at the outer periphery of the element can reduce the stress between the frame and the element. In the case where a clad material having a linear expansion coefficient and/or thermal expansion coefficient larger in the first metal layer than in the second metal layer, the groove formed deeper than the thickness of the first metal layer can further reduce the stress.

Also, in the case where half-etching is provided on the end portion of the lead frame from the lower surface side to prevent the lead frame from detaching from the resin member, the groove may be formed on the upper surface of the lead portion so that in a top view, the outline of the lead appear to have an irregular shape which appears to be made by the recesses passing through from the upper surface to the lower surface of the lead.

(Other Portions)

In the specification, the term "lead frame" includes not only a lead frame that includes only a single unit such as a pair of lead portions, but also includes a lead frame that includes a plurality of units. Therefore, the lead frame may further include a portion which is an extension of a lead portion, a connecting portion which connects lead portions, a portion which reinforce the lead frame, and/or a portion which is extended to outside or an end surface of a resin member to serve as an external terminal, etc. Further, the lead frame may include a portion to provide an additional function such as heat dissipation and/or additional strength etc. In this case, those portions may be electrically separated from a pair of lead frames, or may be partially connected to the pair of lead frames. Those portions may respectively be a portion which is sealed with the resin member to be described below, a portion to be exposed, and/or a portion partially embedded or partially exposed, etc.

The planar shape of the lead frame is not specifically limited as long as it includes lead portions arranged spaced apart from each other and facing with each other. For example, the lead frame may be formed in a tabular shape or a corrugated shape, or partially thick or thin, or a bending tabular or corrugated shape.

(Material)

The lead frame is generally made of an electrically conductive material which serves as a terminal. Examples such material include metals such as Fe, Ni, Co, Ti, Sc, Nb, Zn, Zr, W, Mo, Ta, Cu, Al, Au, Pt, Ag, Rh, Ru, Pd, Os, Ir, Hf, V, Mn, Cr, La, Y, Sn, and alloys of those. Those may have a single-layer structure or a stacked layer structure (for example a clad material). Fe, Ni, and/or Cu is preferably used as its major component. Also, an inclusion of a minute amount of non-metallic elements such as Si, P may be allowed. The thickness of the lead frame may be, for example, about 100 µm to about 1000 µm.

Clad Material

The lead frame of the embodiments preferably includes a clad material. The clad material preferably includes a stacked-layer structure of at least a first metal layer and a second metal layer which is different from the first metal layer. The first metal layer and the second metal layer are needed to have different compositions, and materials which contain the same metal element as their partial component can also be employed. Examples of different metals include metal materials whose linear expansion coefficient and/or thermal expansion coefficient, solubility to a specific etching solution, electrical conductivity, thermal conductivity, reflectance and/or hardness, is different with each other. Among those, metals having different linear expansion coefficient and solubility to a specific etching solution to each other are preferably employed.

The first metal layer and the second metal layer can be selected from the metals or alloys described above. More specifically, the first metal layer preferably has a property that the first metal layer has a linear expansion coefficient or a solubility to a specific etching solution than the second metal layer, copper or copper alloy is more preferable and copper that has an excellent heat dissipating property is further preferable. Particularly, oxygen-free copper that has little impurity and a high thermal conductivity is further preferable. For example, the use of Cu for the portions which serve as the electrode terminals can facilitate soldering and a semiconductor device having good heat dissipation can be obtained. Also, the use of oxygen-free copper at bonding portions with the resin member to be described below allows an improvement in the adhesion of the resin member and the lead frame, and detachment of those can be prevented. Also the use of a copper alloy such as a 194-based alloy, a EFTEC-based alloy, or a KFC-based alloy can facilitates the productivity of the clad material, and can reduce occurrence of warpage, deformation, or the like during processing. The second metal layer is preferably made of iron or an iron alloy, more preferably made of an Inver-based alloy, a SPCC-based alloy, a Kovar-based alloy, or a SUS etc., and further preferably made of a Fe—Ni alloy which has good versatility and workability, or has a low linear expansion coefficient at room temperature.

As described above, adopting a clad material with a stacked-layer structure of the first metal layer and the second metal layer which are made of different metals, properties of the metals can be used in various appropriate combinations, so that while further securing the reliability of the lead frame and of the semiconductor device which uses the lead frame, higher quality can also be achieved.

Particularly, in the case where the first metal layer has a linear expansion coefficient larger than that of the second metal layer, the difference in the linear expansion coefficient with respect to the semiconductor element or the like can be reduced to minimum, or the linear expansion coefficient of the bonding member used for bonding the semiconductor element can be approximated with that of the semiconductor element. As a result, destruction in the bonding between the semiconductor element and the lead frame becomes possible to be efficiently prevented. This effect is remarkable in a face-down type semiconductor device in which, the lead portions are electrically connected to a pair of electrodes of a semiconductor element via a bonding member.

In the case where the first metal layer has a solubility to the etching solution greater than that of the second metal layer, a shape in which the end surface of one of the first metal layer and the second metal layer further protruding than the end surface of the other metal layer can be easily formed. With this, an increase in the contact area between the lead frames and the resin member can be obtained. Also, anchor effect exerted by the lead frame to the resin member can be achieved. Further, the groove of each lead portion as described above can be formed easily by using the difference in the solubility to the etching solution.

Typical examples of a specific etching solution include a solution of ferric chloride or copper chloride. The concentration of the solution is not specifically limited, and in consideration of the type of the first metal layer and the second metal layer, the thickness, the mask pattern used in the etching, etc., a concentration generally used in etching can be applied.

The clad material is sufficient to contain a stacked-layer structure of a first metal and a second metal, and preferably has a so-called full surface overlay structure, but may have a structure which includes a part with an overlay structure, an inlay structure, or an edgeless structure. Also, a three layer structure, a four or more layer structure may be included. In this case, a plurality of one of or both the first metal layer and the second metal layer may be included. The third, the fourth, . . . the n-th metal layer etc., which are different from those metal layers may be stacked between the first metal layer and the second metal layer, or stacked on one or bath surfaces of the stacked layer of the first metal layer and the second metal layer. The third metal layer etc., of different layers in this case can be made of the materials selected from the materials exemplified for the first metal layer and the second metal layer.

Among those, the lead frame preferably made of a clad material which includes a two layer structure made of the first metal layer and the second metal layer, or which includes a three layer structure or a five layer structure which is made of the first metal layer and the second metal layer alternately bonded in this order. In the case where a clad material having a two layer structure is included, the second metal layer is preferably arranged at the semiconductor element side. With this structure, an irregular or rough texture on the end surface can be easily adjusted. Also, appropriately selecting the materials of the first metal layer and the second metal layer allows adjusting of the linear expansion coefficient which allows reliable prevention of destruction in the bonding and reliable heat dissipation.

Particularly, for the lead frame, a three layer structure of the first metal layer/the second metal layer/the first metal layer. With this arrangement, the groove described above can be defined by removing one of the first metal layers by etching, that is, lower portion of the groove can be defined by a two-layer structure of the first metal layer and the second metal layer. Employing such a structure allows simplified the setting of the processing conditions, and thus facilitates formation of the groove.

The thickness of the first metal layer and the second metal layer is not specifically limited and for example the first metal layer and the second metal layer can be formed with a thickness of about several tens of μm to about several hundreds of p.m. Particularly, in a two-layer structure made of the first metal layer and the second metal layer, the first metal layer of about 10 μm to about 300 μm and the second metal layer of about 10 μm to about 300 μm may be employed. In a three-layer structure made of the first metal layer, the second metal layer, and the first metal layer bonded in this order, the first metal layers may respectively have a thickness of about 50 μm to about 200 μm and the second metal layer may have a thickness of about 50 μm to about 200 μm. In this case, the first metal layers may have the same thickness or may have different thicknesses. Particularly, in the case to be used in a semiconductor device, the first metal layer which has a greater thickness is preferably arranged at a side farther from the semiconductor element.

In the case where a shape in which the end surface of either of the first metal layer or the second metal layer is further protruded than the end surface of the other to be employed, a shape which can exert maximum anchor effect is preferable. Examples of such a shape include: (1) a shape in which the end surface of the second metal layer is protruded more than the end surface of the first metal layer, (2) a shape in which all the end surfaces of the first metal layer and the second metal layer in one side in the thickness direction are protruded more than the corresponding end surfaces of the other side respectively, (3) in a clad material of three-layer structure in which the first metal layer, the second metal layer, and the first metal layer are bonded in this order, the end surface of the second metal layer is more protruded than the end surfaces of the first metal layers, (4) the end surface of the second metal layer is slanted so that one end of the end surface of the second metal layer meets the adjacent end of one of the first metal layer and the other end of the end surface of the second metal layer meets the adjacent end of the other first metal layer, (5) the end surfaces of the first metal layers are at inner side than any portions of the end surface of the second metal layer, and (6) The end of the end surface of each of the first metal layers adjacent to the corresponding ends of the end surface of the second metal layer are at outer locations than the other end, which is distal to the corresponding end of the end surface of the second metal layer, of the end surface of each of the first metal layers respectively.

(Plated Layer)

The lead frame may be such that on an above-described clad material which includes the above-described first metal layers and the second metal layer or which further includes the third metal layer etc., a plated layer may be applied on the surface or back-surface or on both the surface and back-surface of the clad material, or on the surface or the back-surface and the end surface of the clad material, or on both the surface and the back-surface and the end surface of the clad material. Examples of the material of the plated layer include Ag, Al, Au or an alloy of those. Among those, a plated layer of Ag is preferable. With this arrangement, in the case where the semiconductor element is a light emitting element, particularly, efficient extraction of light from the light emitting element can be realized. In the case where the first metal layer and/or the second metal layer is not present at the outermost surface of the clad material, the plated layer is not applied in contact with the first metal layer and/or the second metal layer, but is applied in contact with the layer which presents at the outermost surface of the clad material. Also, on the surfaces of the clad material (end surface, upper surface, lower surface), a plated under layer is preferably formed. For example, in the case where the outermost surface to be a Ag plated layer, a plated layer of Cu, Ni, or the like is preferably formed as the plated. The plated layer is preferably formed after processing the lead frame (pattering) to be described below. With this, the plated layer can be applied even further on the end surface of the clad material. The thickness of the plated layer is not specifically limited, and for example, about 1 µm to about 10 µm may be employed.

(Method of Manufacturing Lead Frame)

The lead frame can be produced by using a known method or according to a known method. Particularly, examples of the methods of producing a clad material described above include, a hot-rolling method in which a core material and a surface material in solid state are welded under high temperature and pressure in pressure welding, a fusion welding method such as overlay welding, casting, or tinkering, a non-fusion welding method such as rolling welding, explosive welding, or diffusion welding, or a semi-fusion welding method such as sintering or thermal spraying. More specific examples include a method described in JP H05-102386A. A clad material in which copper or a copper alloy is joined on a core material made of an iron-based alloy such as a ferric stainless steel which is a ferromagnetic substance is preferable.

There are no particular limitations on the method of processing the lead frame, and patterning to obtain a predetermined shape for the lead portions or the like can be performed with the use of a method commonly used to process a lead frame such as pressing, punching, blasting, etching, or the like.

For example, in the case where a clad material is used, a processing is preferably performed so that an end surface of the first metal layer or the second metal layer is more protruded than the end surface of the other metal layer. Examples of such a method include wet etching which uses an etching solution having different etching rates with respect to the first metal layer and the second metal layer. In this case, etching is suitably performed on one surface of the lead frame with the use of a mask-pattern which provides masking or opening of a desired shape. The etching is preferably performed on both surfaces of the lead frame with the use of a mask-pattern which provides masking or opening of a desired shape. With this, the processing time and the processing cost can be reduced. The mask patterns formed on the both surfaces may have the same shape or different shapes.

In the case of wet etching, the shape of the end surface, the pattern shape, or the like, can be easily adjusted by the size (width) of the openings of the mask, the thickness of the mask, the kinds of the mask material, the kinds of the etching solution, the concentration of the etching solution, the method of applying the etching solution (for example, duration of leaching, intensity of shower), frequency/time of application and washing of the etching solution, the temperature of the etching solution, the kinds of the material of the lead frame, the thickness of the lead frame (in the case of a multilayer, the thickness of each layer) etc.

Also, it may be such that with the use of a technique such as pressing, punching, blasting, or the like, which is generally used in processing a lead frame, a desired pattern is formed in the lead frame. Then, a mask pattern which has an opening which is only for the outermost metal layers of the first metal layer and the second metal layer is formed, and performing blasting, etching, etc., a shape in which the end surface of the first metal layer or the second metal layer is protruded more than the end surface of the other end surface.

With the use of the technique as described above, a shape which corresponds to the one unit described above may only be processed, but preferably a shape in which a plurality of the shapes which are arranged in an array is processed. With the use of such a processing method, the end surface of one of the first metal layer or the second metal layer can be formed protruded more than the end surface of the other metal layer and the degree of protrusion can be easily adjusted. With this arrangement, in the case where the lead frame is used in a semiconductor device, anchor effect to the resin member which will be described below, can be more efficiently exerted. Particularly effective in the application to the chips of extremely small size and the semiconductor device of extremely low height.

For forming the groove, an example of a patterning with a predetermined shape is applied on the lead frame, a mask is applied on the all surface of the back surface of the lead frame, then, a mask having openings corresponding to the grooves and/or to the location of the recesses in the element mounting regions respectively is disposed on the surface of the lead frame. Then, adjusting the wet etching conditions described above, etching is carried out only on the surface. Particularly, in the case where the clad material as described above is used, using the difference in the solubility to the etching solution, etching is carried out to the first metal layer or the second metal layer. Thus, the grooves or the like can be easily formed.

As described above, in the case where the lead frame to have a plated layer disposed on the surface and/or the back surface and/or the end surface of the lead frame, the plating is preferably disposed after processing the lead frame. In the case where the clad material is used, the first metal layer and the second metal layer may not be exposed at the end surface of the lead frame after processing. The lead frame may be cut after applying the plating. In the case where the clad material is used, the first metal layer and the second metal layer may be exposed from a part of the end surface of the lead frame, and the end surfaces may be on a same plane or on an approximately same plane.

Semiconductor Device

The semiconductor device according to the present embodiments includes, the lead frame describe above, a semiconductor element mounted on the lead frame, and a resin member fixing the lead frame.

(Semiconductor Element)

The semiconductor element is not specifically limited and any semiconductor element constituted with an element semiconductor such as silicon, germanium, or a compound semiconductor such as a Group III-V compound may be employed. Particularly, the semiconductor element is preferably a light emitting element. The light emitting element is generally constituted with a semiconductor layer which includes a light emitting layer and which is stacked on a substrate. The light emitting element may also be constituted with a semiconductor layer obtained by, on a substrate, stacking a semiconductor layer which includes a light emitting layer and then, removing the substrate. Next, a light emitting element which is a semiconductor element will be described as an example.

(Substrate)

The substrate is not specifically limited and for example, a substrate generally used for growing a nitride semiconductor layer can be employed. Among those, a light transmissive substrate is preferable. In the specification, the term "light transmissive" means properties of transmitting about 60% or greater, 65% or greater, 70% or greater or 80% or greater emission of the light emitted from the light emitting element. Examples of the substrate include sapphire, spinel, NGO, $LiAlO_2$, $LiGaO_3$, GaN, etc. Among those, a substrate made of an oxide is preferable, a substrate made of a wurtzite-type crystal is more preferable, and a sapphire substrate is further preferable.

(Semiconductor Layer)

The semiconductor layer stacked on the substrate (for example, on the first main surface) preferably includes at least a light emitting structure. More specifically, the semiconductor layer may include, for example, on the substrate, a first semiconductor layer (n-type semiconductor layer), a light emitting layer, and a second semiconductor layer (p-type semiconductor layer) which are stacked in this order.

The semiconductor layer includes a structure in which a part of the second semiconductor layer is removed in the thickness direction, in other words, partially removed, and on which the first semiconductor layer is exposed, and on the region of the first semiconductor layer other than the exposed region, the light emitting layer and the second semiconductor layer are stacked. The first semiconductor layer, the light emitting layer, and the second semiconductor layer which are among the components of the semiconductor layer are not specifically limited, and for example, nitride-based compound semiconductors such as $In_XAl_YGa_{1-X-Y}N$ ($0 \leq X$, $0 \leq Y$, $X+Y \leq 1$) can be preferably used. Those nitride semiconductor layers may respectively have a single layer structure, a stacked layer structure made of layers having different compositions and/or thicknesses, or a superlattice structure etc. Particularly, the light emitting layer preferably has a single quantum well structure or a multi-quantum well structure in which thin layers are stacked to produce quantum effect.

(Electrode)

A pair of electrodes of a semiconductor element is arranged on a same surface side of the semiconductor layer. The pair of the electrodes may have either a single layer structure or a stacked layer structure which can be ohmically connected to the first semiconductor layer and the second semiconductor layer described above respectively, which provides a linear or semi-linear current-voltage characteristics. Such electrodes can be formed using any suitable material and structure known in the art, with an appropriate thickness respectively. For example, 10 µm~300 µm is preferred.

Particularly, as described below, in the case where the pair of electrodes of the semiconductor element is electrically connected to the lead portions via a bonding member respectively, a reflective layer (plated layer, DBR layer, etc.) is preferably disposed as the layer closest to the semiconductor layer on each of the pair of the electrode.

The reflective layer is preferably made of a material which has relatively large wavelength dependency in visible light range, and particularly, made of a material whose reflectivity abruptly increases in near violet range to a long wave range. More specifically, the reflective layer is preferably made of a material which can efficiently reflect light of wavelength region (to red region) 350 nm or greater, more preferably 380 nm or greater, further preferably 400 nm or greater. More specifically, Ag or an alloy of Ag may be employed. Examples of Ag alloys include an alloy of Ag with one or at least two metal elements selected from the group consisting of Pt, Co, Au, Pd, Ti, Mn, V, Cr, Zr, Rh, Cu, Al, Mg, Bi, Sn, fr, Ga, Nd, and Re (rare earth). The thickness of the reflective layer may be suitably, in view of efficiently reflecting the incident light, about several tens of nm to about several tens of nm to about several µm. Examples of the DBR layer include $Nb_2O_5$, $TiO_2$, $ZrO_2$, $Ta_2O_3$, $HfO_2$, $SiO_2$, $Al_2O_3$, and $MgF_2$.

With the use of the materials described above, particularly in the light emitting element, light emitted from the semiconductor layer is reflected and is efficiently extracted. Also, a semiconductor device having good heat dissipation properties can be obtained. As a result, generation of heat at the time of applying a large current can be reduced and thus the light emitting element of higher output can be realized.

The pair of electrodes of the semiconductor element is generally electrically connected respectively to the lead portions (particularly to the element mounting portions) of the lead frame to be described below, through a bonding member. That is, connected in a face-down manner. In the specification, the term "shape of electrode" of a semiconductor element refers to a surface shape of the electrode (pad electrode) which is in contact with the element mounting region. The electrode (ohmic electrode) which is formed under the pad electrode and is in contact to the semiconductor layer may have a shape different from the shape of the pad electrode and/or the shape of the element mounting region. In the case where employing a structure in which the p-electrode and the n-electrode are partly stacked, for example, stacking an n-electrode via an insulating layer above the p-electrode, the shapes of the p-electrode and the n-electrode which are exposed on the outermost surface preferably in conformity to the element mounting region of the lead frame.

Also, for the light emitting element, a white light emitting element in which a fluorescent material layer is previously formed, a white light emitting element in which a reflective layer made of a resin and/or a metal is formed on the side surfaces and/or a fluorescent material layer is formed on the upper surface of a light emitting element, or the like, may be employed. Further, a light emitting element in which electrodes to connect to a mounting surface are made thick and a stress relaxation layer such as a resin (a white resin) is disposed around it, can also be employed.

(Bonding Member)

The bonding member can be formed using a material which is generally used at the time of bonding a semiconductor element, and for example, a eutectic alloy, solders may be used. Examples of preferable eutectic alloy include a eutectic alloy film such as an alloy whose main components are Au and Sn, an alloy whose main components are Au and Si, and an alloy whose main components are Au and Ge. Further, an alloy mainly containing Cu and Sn and Ag, an alloy mainly composed of Sn and Cu, or an alloy mainly composed of Sn and Bi can be cited as a solder. Among those, an AuSn eutectic alloy is preferable. The use of an Au—Sn eutectic alloy can reduce the degradation of the electrodes of the semiconductor element caused by the thermocompression bonding, and also allows for firm bonding to the lead frame.

(Resin Member)

The resin member serves to fix the leaf frames. The resin member also serves to cover the grooves and/or recesses of the surface of the element mounting regions of the lead frames. In the case where the resin member is applied to cover the grooves and/or the recesses, the covering is preferably applied to form a flat surface. In the case where a light emitting element is used as the semiconductor element, the resin member preferably includes a reflective surface which can reflect light from the light emitting element.

A resin such as a thermosetting resin or a thermoplastic resin can be employed as the resin member. Specific Examples of such a resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition, polyphthalamide (PPA), a polycarbonate resin; a polyphenylene sulfide (PPS); a liquid crystal polymer (LCP); an ABS resin (acrylonitrile-butadiene-styrene resin); a phenolic resin; an acrylic resin; and a PBT resin (polybutylene terephthalate resin). Particularly, a thermosetting resin is preferable. Among those, in the case where a light emitting device employing a light emitting element to be obtained as the semiconductor device, the resin member preferably has the reflectivity with respect to the light from the light emitting element 60% or more, more preferably 70% or more, 80% or more or 90% or more.

For example, a light reflective material such as titanium oxide, silicon dioxide, zirconium dioxide, potassium titanate, alumina, aluminum nitride, boron nitride, and/or mullite. With this arrangement, light can be reflected efficiently. The light reflective material can be adjusted appropriately according to the conditions of molding such as a method of resin molding or the resin fluidity, or to the properties such as a reflectance and/or mechanical strength. For example, in the case where titanium oxide is employed, an amount of 20 to 40 weight %, further 25 to 35 weight % of titanium oxide is preferably contained with respect to the total weight of the resin material.

The resin member is arranged between the pair of lead frames (that is, lead portions) described above to insulatingly separate the pair of lead frames. The resin member arranged between the lead portions which are spaced apart from each other and opposite to each other preferably cover all the end surfaces in the thickness direction of the lead frames. As described above, in the case where the lead frame has a shape in which a part of the end surface of the lead frame is protruded, for example, in the case where the lead frame is made of a clad material and has a shape in which the end surface of the first metal layer or the second metal layer is protruded more than the end surface of the other metal layer, all the end surfaces in the thickness direction are covered and embedded in the resin member. Thus, the contact area between the lead frames and the resin member is increased and which improves the adhesion between the lead frames and the resin member. Also, with such a partial protrusion of the end surface of the lead frame, an anchor effect can be efficiently obtained.

Particularly, as described above, in the case where the first metal layer, a second metal layer, and the third metal layer are bonded in this order to form a three layer structure, and in which all the end surfaces of the first metal layer or the second metal layer in the thickness direction protrude more than the end surfaces of the other metal layer, reliable anchor effect in both an upward direction and downward direction can be obtained. In the case where all the end surfaces in the thickness direction of the second metal layer are protruded more than all the end surfaces of the first metal layer or than the most-protruding end surface of the first metal layer, an anchor effect can also be exerted more efficiently to the resin portion, due to a difference in the linear expansion coefficient of the first metal layer and the second metal layer.

The semiconductor device according to the embodiments, particularly, in the case where a light emitting element is used for the semiconductor element, a light transmissive member which covers a part of the light emitting element and the lead frame may be arranged separately to the resin member described above. The light transmissive member is, in view of light luminous intensity distribution and directivity of the light emitted from the light emitting element, a concave lens shape or a convex lens shape may be employed. Such a light transmissive member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

The light transmissive member may contain a wavelength converting member such as a fluorescent material capable of absorbing light from the light emitting element and emitting light of different wavelength. For example, an oxide-based fluorescent material, a sulfide-based fluorescent material, and/or a nitride-based fluorescent material etc., can be employed. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material (β-sialon-based fluorescent material) to emit green light, and a SCASN-based fluorescent material and a CASN-based fluorescent material, a KSF-based fluorescent material ($K_2SiF_6$:Mn), a sulfide-based fluorescent material to emit red light, can be used singly or in combination. The light transmissive member may contain a light diffusing agent (barium sulfate, titanium oxide, aluminum oxide, silicon oxide, etc.).

In the semiconductor device, a protective element such as a Zener Diode, a Bridge Diode etc., may be arranged on the lead frame.

Embodiment 1

Figure 1B:
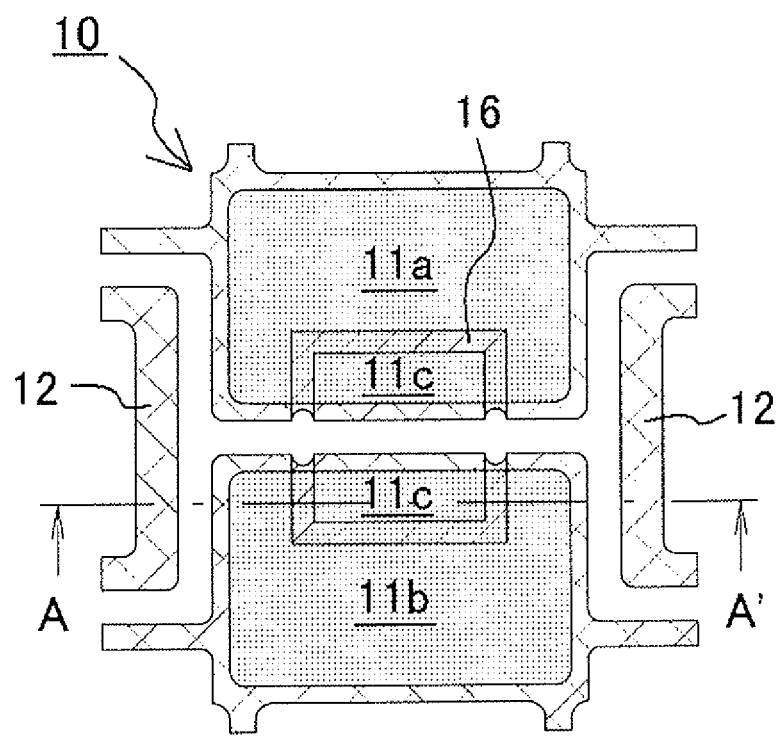
FIG. 1B is a plan view showing a lead frame unit shown in FIG. 1A.
Figure 1C:
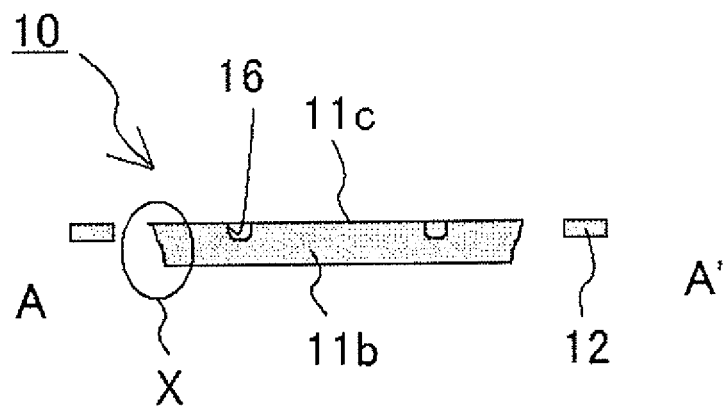
FIG. 1C is a cross sectional view taken along line A-A' of FIG. 1B.

On the lead frame 10 in Embodiment 1 includes, particularly, as shown in FIG. 1A, a single unit U which constitutes a single light emitting device as a single semiconductor device are arranged in plural in the longitudinal direction and the direction perpendicular to the longitudinal direction. Such a single unit U of the lead frame 10, as shown in FIG. 1B and FIG. 1C, is divided in two portions in a plan view, and a pair of positive and negative lead portions 11a, 11b are respectively arranged. The lead portions 11a, 11b which are the portions divided in two, respectively include an element mounting region 11c demarcated by the groove formed in the surface of the lead frame 10. With such an arrangement of the groove 16, excessive flow of the bonding member can be prevented at the time of bonding a light emitting element by using a bonding member such as a solder, which allows bonding of the light emitting element at an appropriate locations by using self alignment effect. Particularly, a resin member to be described below is preferably filled in the groove 16. With the arrangements of the members described above, more efficient self-alignment effect can be obtained.

Also, in the lead frame 10, support bars 12 are arranged at the both sides of the two lead portions 11a, 11b, so as to bridge from the lead portion 11a to the lead portion 11b.

Figure 1D:
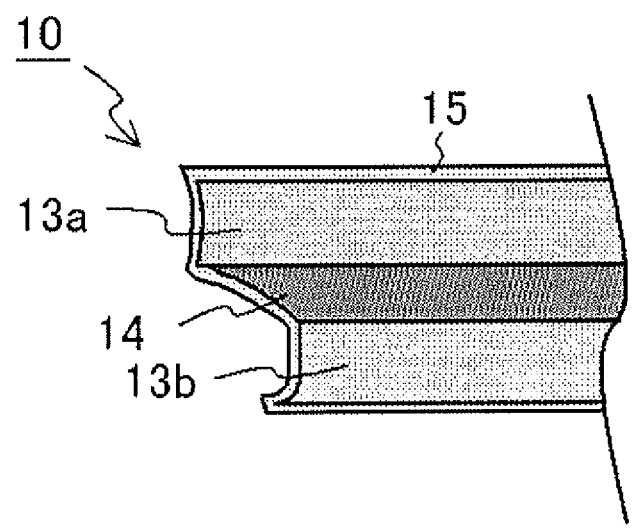
FIG. 1D is an enlarged view of a major portion X shown in FIG. 1C.

The lead frame 10 is made of a clad material, which is, particularly, as shown in FIG. 1D, from the top (from the side where a light emitting element to be disposed), a first metal layer (about 100 µm in thickness) made of a copper alloy (194), a second metal layer 14 (about 50 µm in thickness) made of an iron alloy (an Fe—Ni alloy, Ni content (36%) about 50 in thickness) are stacked to form a stack layer structure of a first metal layer 13/a second metal layer 14/a first metal layer 13b. The surface and the back-surface of the clad material, that is, the outer surfaces of the first metal layer 13a, 13b and the end surface of the clad material are covered with a plated layer 15 made of Ag (about 2 to 3 µm in thickness).

In the lead frame 10, the end surface of the first metal layer 13a is more protruded than the end surface of the second metal layer 14. Accordingly, the anchor effect can be efficiently obtained. The end surface of the second metal layer 14 is slanted from the end of the second metal layer 14 side of the first metal layer 13a to meet the end of the second metal layer 14 side of the first metal layer 13b. Further, the end surface of the first metal layer 13b is located at inner side than any portions of the end surface of the first metal layer 13a. Further, the end of the first metal layer 13b adjacent to the second metal layer 14 is located at outer side than the end of the first metal layer 13b which is located opposite side from the second metal layer 14. With such a structure, adhesion with the resin member can be enhanced and also difference in the linear expansion coefficients between the resin member and the lead frame and between the semiconductor element (light emitting element) and the frame can be reduced, and reliability in the bonding of those components can be improved.

Such a lead frame can be manufactured according to the method below. First, a clad material having a stacked-layer structure of a first metal layer 13a/a second metal layer 14/a first metal layer 13b is prepared. In the clad material, the joining interface between the first metal layer and the second metal layer is diffusion-joined so as not to allow detachment between the metal layers. On the surface of the clad material, for example, a resist is disposed on the entire surface, and conducting a photolithography process, in detail, through carrying out exposure with the use of an exposure mask having a desired pattern, and then developing, a resist mask having a desired shape is disposed. The mask is used as the etching mask for the lead frame. The pattern shape in this case corresponds to the shapes of the lead portions 11a, 11b, the support bar 12, etc., shown in FIG. 1A, FIG. 1D, etc. In a similar manner, a pattern of predetermined shape is formed on the back-surface of the clad material to form a resist mask. In this case, the pattern shape may be the same shape as that formed on the surface. Also, an opening with a slightly wider aperture size than the opening of the mask formed on the surface may be formed. It is preferable that the center lines of the openings of the masks of the surface and the back-surface are arranged to overlap in projection view. After forming a resist mask on the surface and the back-surface of the clad material, for example, at 45° C., a ferric chloride solution ($FeCl_3$ concentration: 3.2 mol/L, chloride concentration: 0.7 to 2.0 wt %, specific gravity 1.4 g/cc) is sprayed for about 6 minutes to etch the clad material to form the pattern. At this time, a mask with narrow openings for the grooves may be disposed on the surface side of the lead frame, so that the grooves can be formed simultaneously.

Next, the mask formed earlier is removed and a mask having openings corresponding to the grooves 16 is formed on the surface (upper surface) of the lead frame 10, and also a mask which covers the entire back-surface is formed. Then, for example, at 45° C., a ferric chloride solution ($FeCl_3$ concentration: 3.2 mol/L, chloride concentration: 0.7 to 2.0 wt %, specific gravity 1.4 g/cc) is sprayed for about 4 minutes to etch the clad material to form the grooves 16. Alternately, a mask having openings corresponding to the grooves 16 is formed on the surface, and on the back-surface, instead of forming the full-surface mask, a mask having openings corresponding to the outer periphery of the lead portions 11a, 11b including the element mounting region 11c and the groove portion 16, a portion connected to the outer periphery, and when needed, openings corresponding to the support bar 12 is formed, to etch the clad material.

With this, the grooves 16 are etched from the surface side partially in the thickness direction (for example, the first metal layer in a part or all of its thickness direction). Further, the outer periphery of the lead portions 11a, 11b including the element mounting region 11e and the groove 16, the portions connected to the outer periphery, when needed the support bar 12 (portion shown by cross-hatching in FIG. 1A and FIG. 1B) are processed such as by etching from the back-surface side partially into the thickness direction (for example, the first metal layer in a part or all of its thickness direction). Accordingly, in those portions, thicknesses can be reduced while retaining the planar shapes respectively. With the etching as described above, the problems as shown below can be solved. For example, as a method for partially changing the thickness of the lead frame in its thickness direction, press-working etc., has been conventionally used. However, when press working is applied, metals corresponding to the reduced thickness are pushed in the in-plane direction, resulting in a change of the planar shape. In recent years, corresponding to miniaturing the light emitting devices, the distance between the electrodes and the terminals and their margins are also miniaturing, and under such circumstances, a change in the planar shape may lead to short circuit between the electrodes and the terminals.

On the other hand, when such a change in the thickness as described above is applied in the lead frame of a semiconductor device, a part of the lead (lead portions 11a, 11b, the element mounting region 11c) can be exposed from both the upper surface and the lower surface of the resin member to utilize, and the heat dissipating properties of the light emitting element can be improved. On the surface of the lead frame, a member having poor wettability to a metal bonding member (a solder etc.) can be filled in the groove 16. With this arrangement, the bonding member can be disposed on an appropriate location and easily demarcated in an appropriate size. With this arrangement, self-alignment effect can be appropriately produced at the time of bonding the light emitting element, facilitating arrangement of the semiconductor element to the appropriate location. Further, the resin member can be applied on the outer peripheries of the lead portions 11a, 11b including the element mounting region 11c and the groove 16, the portions connected to the outer periphery, and optionally the back-surface side of the support bar 12, so that short circuit of the lead frame can be prevented effectively.

Then, using a plating solution containing silver ions, a plated layer is formed on the surface of the lead frame. The conditions of plating can be appropriately adjusted according to the material etc. Before forming the plated layer, as a pretreatment, a degreasing treatment is preferably applied to remove organic substances from the surface of the lead frame. Further, next to degreasing treatment, surface activation of the lead frame with the use of oxidation or the like is preferably performed. Also, a layer which can improve the adhesion between the silver plated layer and the lead frame may be disposed. For example, a thin layer of about 0.2 μm thickness, such as a strike plated layer, may be disposed as an under layer. Further, a plated layer having a silver plated layer as its outermost surface can be made with various stacked-layer structures, for example, forming a stacked-layer of Ni/Pd/Au/Ag in this order from the lead frame side, a plated layer having high thermal resistance can be obtained. In the case where the lead frame contains iron, for example, a clad material such as Cu/Fe/Cu, the end surface of Fe exposed by the working may be covered with a plated layer, so that the end surface of Fe can be prevented from corrosion. Thus, the lead frame described above can be obtained.

Embodiment 2

Figure 2A:
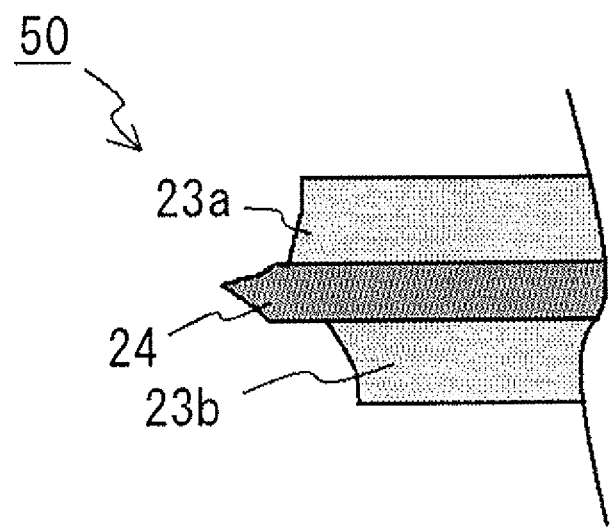
FIG. 2A is a partially enlarged view of a lead frame according to Embodiment 2 of the present invention.

The lead frame 50 according to Embodiment 2 has a similar structure as the lead frame according to Embodiment 1, except that, particularly shown in FIG. 2A, the lead frame 50 is made of a clad material in which a first metal layer 23a of a layer (about 100 μm thickness) made of a copper alloy (194), and a second metal layer 24 of a layer (about 100 μm thickness) made of an iron alloy (Fe—Ni alloy, Ni: 36 wt %) are stacked to form a stacked-layer structure of first metal layer 23a/second metal layer 24/first metal layer 23b, and in the shape of the end surfaces, the second metal layer 24 is protruded more than the first metal layers 23a, 23b. Such a lead frame 50 can be manufactured according to the method below. The lead frame 50 can be manufactured in a similar manner as in Embodiment 1, except that, in Embodiment 2, for example, the etching solution of the lead frame used in Embodiment 1 is changed to a copper chloride solution, and the size of the opening of the mask made of a resist and etching conditions are adjusted. For example, after forming a resist mask on the surface and the back-surface of the lead frame (clad material), at 45° C., a copper chloride solution (CuCl$_3$ concentration: 2.2 mol/L, chloride concentration: 3.0 mol/L, specific gravity 1.28 glee) is sprayed for about 6 minutes to etch the clad material to form the pattern. The etching rate of the copper chloride solution to an iron-based alloy is smaller than that of the ferric chloride solution, so that the Fe-based alloy at a middle portion of the layer can be left easily. With the use of the lead frame as described above, similar effects as in Embodiment 1 can be exerted. Moreover, the end surface is markedly protruded at a middle part of the lead frame in the thickness direction, so that a greater anchor effect can be obtained with a simple technique.

Variation Example of Embodiment 2

Figure 2B:
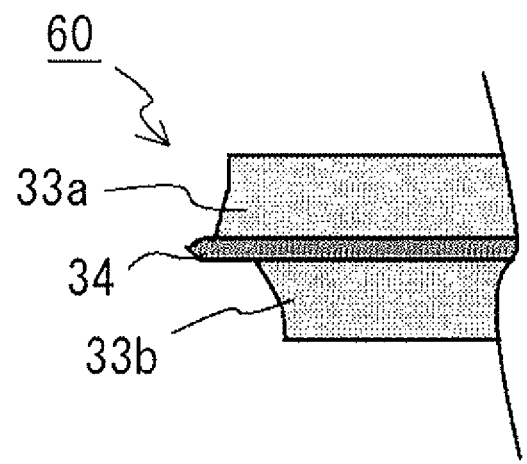
FIG. 2B is a partially enlarged view of a lead frame according to Variation Example of Embodiment 2 of the present invention.

The lead frame 60 according to Variation Example of Embodiment 2 has a similar structure as the lead frame according to Embodiment 1 and Embodiment 2, except that, particularly shown in FIG. 2B, the lead frame 60 is made of a clad material in which a first metal layer 33a of a layer (about 150 μm thickness) made of a copper, and a second metal layer 34 of a layer (about 50 μm thickness) made of an iron alloy (Fe—Ni alloy, Ni: 36 wt %) are stacked to form a stacked-layer structure of first metal layer 33a/second metal layer 34/first metal layer 33b, and in the shape of the end surfaces, the second metal layer 34 is protruded more than the first metal layers 33a, 33b. Such a lead frame 60 can be manufactured in a similar manner as in Embodiment 2, except for reducing the thickness of the second metal layer. With the use of the lead frame as described above, similar effects as in Embodiment 2 can be exerted. Particularly, a very simple technique of adjusting the thickness of the second metal layer enables adjustment of the degree of protrusion, which allows reliable prevention of short-circuit between the lead framed.

Embodiment 3

Figure 3:
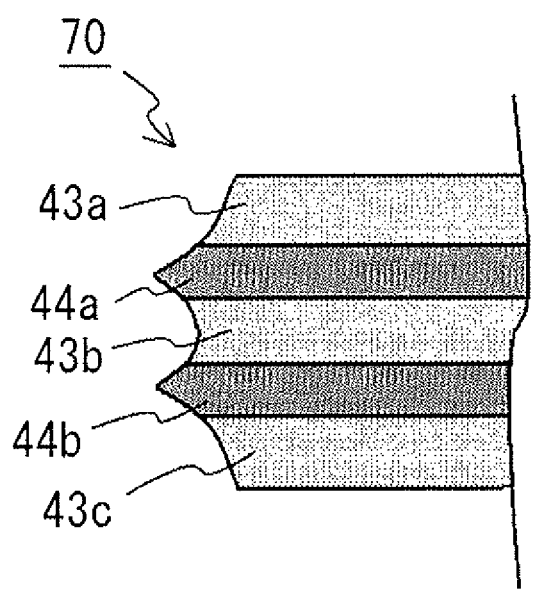
FIG. 3 is a partially enlarged view of a lead frame according to Embodiment 3 of the present invention.

The lead frame 70 according to Embodiment 3 has a similar structure as the lead frame according to Embodiment 1, except that, the lead frame 70 is made of a clad material, particularly shown in FIG. 3, the first metal layer 43a of a layer made of copper (about 100 μm thickness) and the second metal layer 44 of a layer made of an iron alloy (Fe—Ni—Co alloy, Ni: 31%, Co: 5%) (about 100 μm thickness) are stacked to form a stacked-layer structure of the first metal layer 43a/the second metal layer 44a/the first metal layer 43b/the second metal layer 44b/the first metal layer 43b, and in the shape of the end surfaces, the second metal layers 24a, 24b are protruded more than the first metal layers 43a, 43b, 43e. Such a lead frame 70 can be manufactured in a similar manner as in Embodiment 2. With the use of the lead frame as described above, similar effects as in Embodiment 1 and Embodiment 2 can be exerted. Moreover, the end surface is protruded in two steps at a middle part of the lead frame in the thickness direction, so that a greater anchor effect can be obtained with a simple technique.

Embodiment 4

Figure 4A:
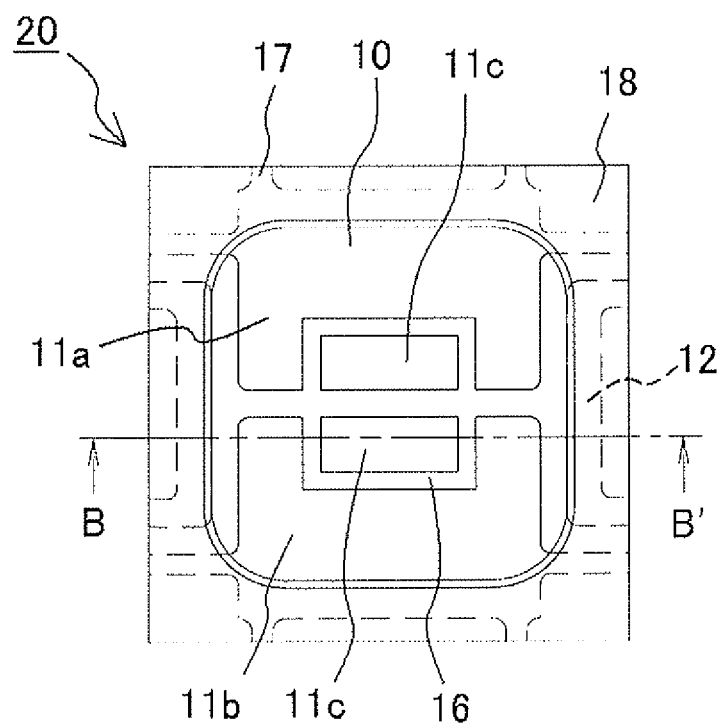
FIG. 4A is a plan view of a light emitting device according to Embodiment 4 of the present invention.
Figure 4B:
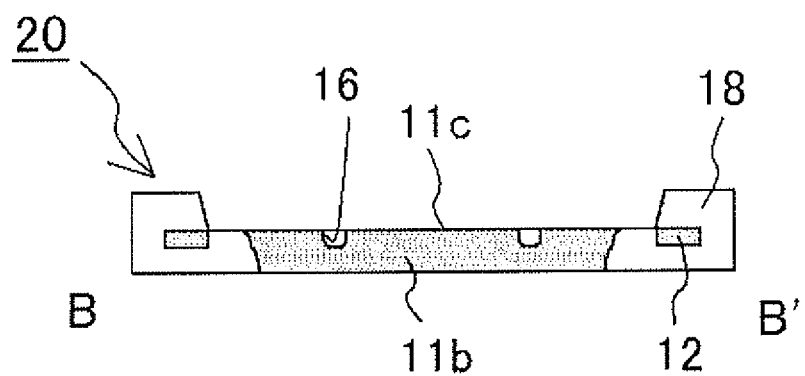
FIG. 4B is a cross-sectional view of a major portion taken along line B-B' of FIG. 4A.

The semiconductor device (light emitting device) 20 according to Embodiment 4 includes, particularly, as shown in FIG. 4A and FIG. 4B, the lead frame 10 as in Embodiment 1, the resin member 18 which embeds and fix a part of the lead frame 10, and the light emitting element (21 in FIG. 4C) mounted on the lead frame 10. In FIGS. 4A, 4B, in order to clarify the positional relationship between the lead frame, the terminal portions 17 of the lead frame, and the resin member, illustration of other members is omitted.

Figure 4C:
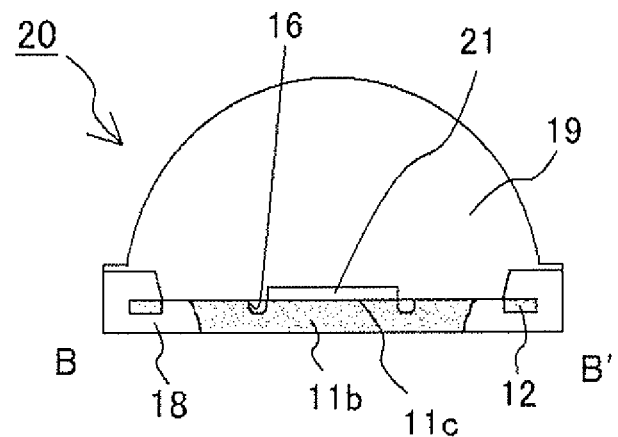
FIG. 4C is a schematic cross-sectional view of a light emitting device according to Embodiment 4 of the present invention.

Between the lead portions 11a, 11b which are spaced apart from each other and opposite to each other, the resin member 18 covers all the end surfaces in the thickness direction of the lead frame 10. The light emitting element 21 includes a pair of positive and negative electrodes on a same surface side. The light emitting element 21 is disposed in a face-down manner bridging between the two lead portions 11a, 11b of the element mounting region 11c of the lead frame 10. That is, with the use of a eutectic solder (Au-Sn) as the bonding member, each of the electrodes of the light emitting element 21 are connected to the lead portions 11a, 11b of the lead frame 10 which are extending to the positive and negative terminals, respectively. The positive and negative electrodes of the light emitting element have a shapes in conformity to the element mounting regions of the lead flame, and in the embodiment, the electrodes of the positive side and the negative side are formed in rectangular shapes with approximately same shape and size. As described above, forming the positive electrode and the negative electrode with an approximately same size allows for more uniform distribution of stress at the time of bonding, so that high bonding strength can be obtained. Also, as shown in FIG. 4C, over the resin member 18, the light transmissive member 19 covering a part of the lead frame 10 and the light emitting element 21 is arranged in a convex lens shape.

Although not shown, a protective element is mounted on a lead frame 10 which does not have a light emitting element 21 mounted thereon, and the protective element is electrically connected to the lead frame 10 via electrically conductive wires.

In Embodiment 4, a reduction in the linear expansion coefficient of the lead frame itself is achieved due to the use of a Fe-alloy, which has a linear expansion coefficient smaller than that of Cu which is generally used for a lead frame, as the second metal layer 14. With this arrangement, the linear expansion coefficient of the lead frame can be approximated to the linear expansion coefficient of the light emitting element itself. As a result, joint breakage between the light emitting element (for example, electrode) and the lead frame can be prevented. This effect is remarkable, particularly, in the case where the light emitting element is bonded on the lead frame in a face-down manner. Accordingly, in the case where any member is used as the bonding member to bond the light emitting element and the lead frame, with the reduction in the linear expansion coefficient of the lead frame, even there is a difference in the linear expansion coefficients between the bonding member and the light emitting element, the difference becomes possible to be canceled out. Thus, joint breakage between the light emitting element and the lead frame can be further prevented.

Further, while realizing a reduction in the linear expansion coefficient of the lead frame, a material having a linear expansion coefficient larger than that of the light emitting element but has good heat dissipating property can also be used. Accordingly, the heat dissipating property of the light emitting element can be maintained or improved. This also allows employing of a material which has good adhesion with the resin member and/or the bonding member while achieving a reduction in the linear expansion coefficient of the lead frame. Accordingly, the light emitting device of higher reliability can be obtained.

In the lead frame, for example, in the case where the first metal layer (surface) is copper or a copper alloy, the stress due to difference in the linear expansion coefficients between copper and the semiconductor element (light emitting element) can be reduced. In the case where the semiconductor element (light emitting element) is directly mounted on the lead frame in face-down manner, due to the difference in the linear expansion coefficient between the copper and the element, breakage tends to occur. However by applying partial etching as described above, the mounting area of copper of the first metal layer can be divided by the outer periphery and the groove, so that effect from the difference in the linear expansion coefficient between copper and the element can be reduced. On the other hand, in the case where the first metal layer (surface) is made of iron or an iron alloy, applying an etching on the end surface of the second metal layer allows an improvement in the adhesion with the resin. Also, iron scarcely dissolves in the etching solution, so that the size of opening is reduced in the etching mask applied to cover the upper surface and etching is carried out. Thus, etching can be applied in a shape expanding inward, and therefore adhesion with the lead frame can be improved.

Embodiment 5

Figure 5:
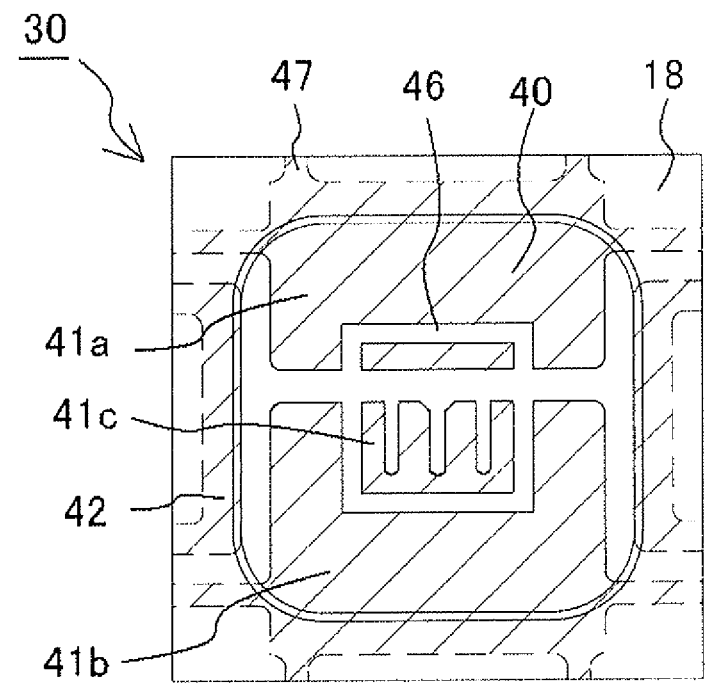
FIG. 5 is a plan view of a light emitting device according to Embodiment 5 of the present invention.

The light emitting device according to Embodiment 5 has a substantially similar structure as in the light emitting device according to Embodiment 4, except that, as shown in FIG. 5, the shape of the element mounting region 41c of the lead frame 40 is demarcated to be smaller at the lead portion 41a side by the groove 46, and an irregular shape is arranged on the surface of the lead portion 41b. In FIG. 5, in order to clarify the positional relationship between the lead frame 40, the terminal portion 47 and the resin member 18, illustration of other members is omitted.

The recess in the comb-like shape on the surface of the lead portion 41b can be formed such that, in the method of manufacturing lead frame in Embodiment 1, together with the opening for the groove, a pattern of an opening in a comb-like shape, is also formed in the mask for forming the groove, and etching is carried out simultaneously to the etching of groove 46. With such a comb-like recess, the shape of the element mounting region 41c of the lead portion 41a can be formed in conformity to the shape of the electrode of the light emitting element. Accordingly, the self-aligning effect of the light emitting element can be further produced. As a result, the light emitting element can be bonded easily to an appropriate location.

Embodiment 6

Figure 7A:
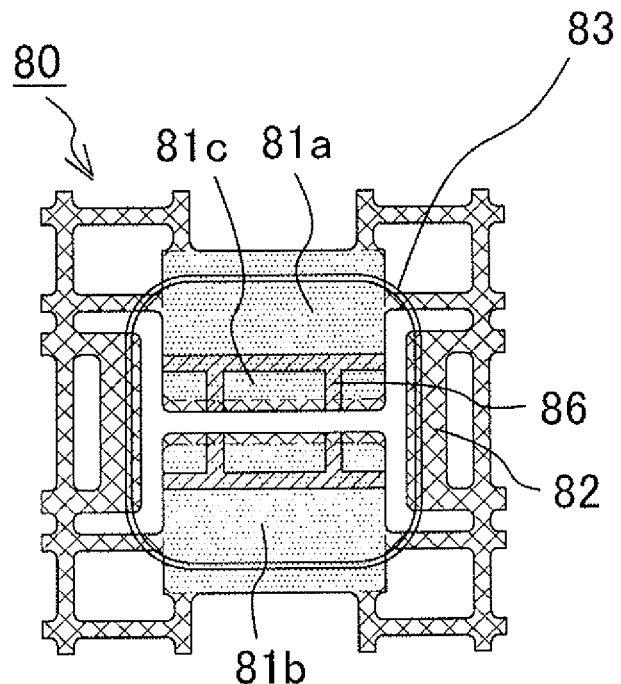
FIG. 7A is a plan view of a lead frame according to Embodiment 6 of the present invention.
Figure 7B:
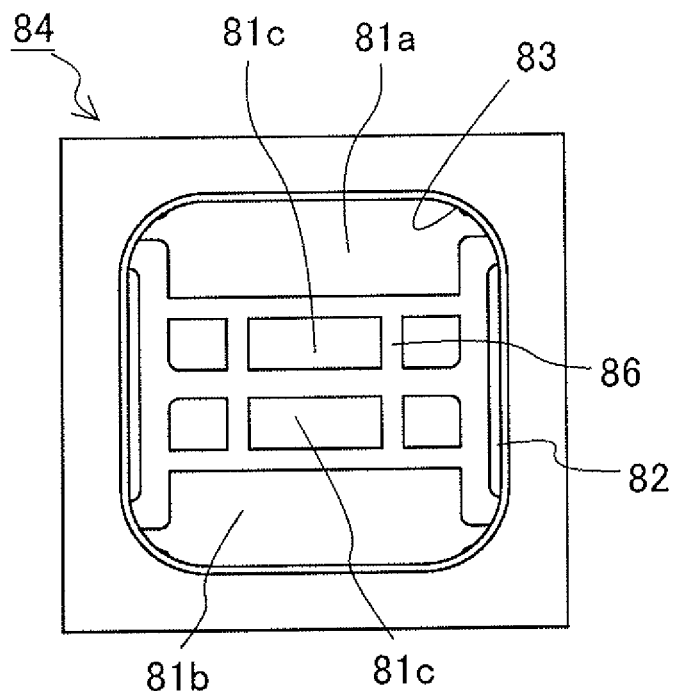
FIG. 7B is a plan view of a light emitting device according to Embodiment 6 of the present invention.

The light emitting device 84 according to Embodiment 6 has a substantially similar structure as in the light emitting device according to Embodiment 4, except that, as shown in FIGS. 7A and 7B, the shape of the element mounting region 81c of the lead frame 80 is demarcated by the groove 86, and the sides of the groove 86 approximately in parallel to respective opposite sides of the lead portions 81a, 81b extend to the end portions of the lead portions 81a, 81b respectively. In FIGS. 7A, 7B, in order to clarify the positional relationship between the lead frame 80 and the resin member, illustration of other members is omitted. In addition, in the lead frame 80, the outer frame etc., are shown, so that the opening 83 in the resin member to be provided in the light emitting device 84 is also shown.

Embodiment 7

Figure 8A:
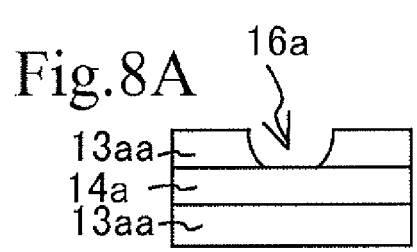
FIGS. 8A to 8F are cross-sectional views of a lead frame according to Embodiment 7 of the present invention.
Figure 8B:
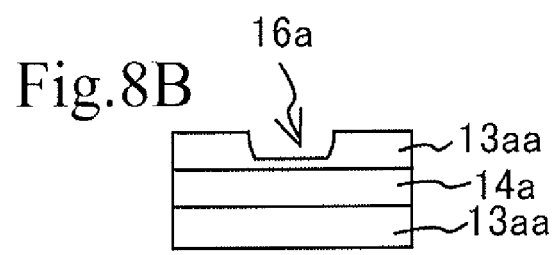
Figure 8C:
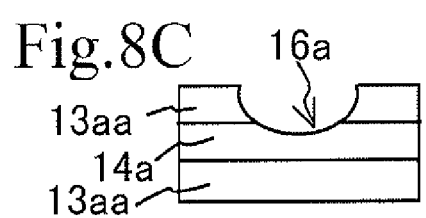
Figure 8D:
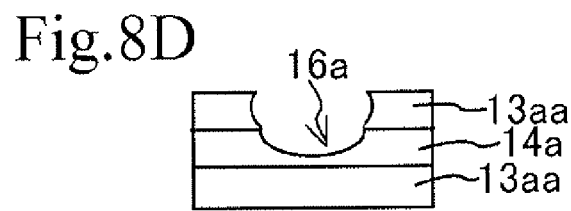
Figure 8E:
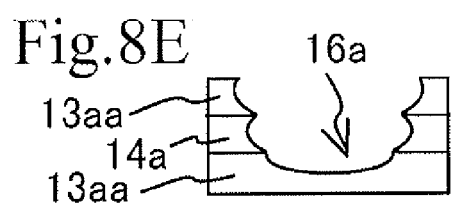
Figure 8F:
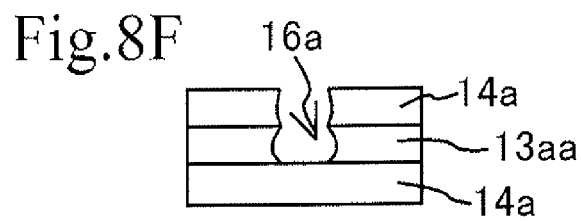

The lead frame according to Embodiment 7 has a similar structure as the lead frame of Embodiment 1, except for, as shown in FIGS. 8A to 8F, the shape of the end surface of one groove 16a and/or the stacking order of the metal layers shown in a cross-sectional view taken along line A-A' of FIG. 1B. In FIGS. 8A to 8F, respectively, the first metal layer 13aa is made of copper or a copper alloy and the second metal layer 14a is iron or an iron alloy. The width of the groove 16a is preferably 60 µm to 200 µm. The depth is 10 µm to 200 µm, respectively. FIGS. 8A to 8E each illustrates a clad material having copper or a copper alloy at the upper surface, but the depth and the shape of the groove 16a are selected according to the degree of stress with the mounting element which to be reduced. For example, in the case where the difference in the linear expansion coefficients with the element to be decreased, among FIGS. 8A, 8C to 8E, the deeper, the more preferable. In order to secure the adhesion with the filled resin and to prevent detachment, protrusions may be formed between different materials as shown in FIG. 8D to 8F. Particularly, as shown in FIG. 8F, a structure where the resin hardly detaches can be made using the low degree of solubility of iron or an iron-based alloy.

Embodiment 8

Figure 9A:
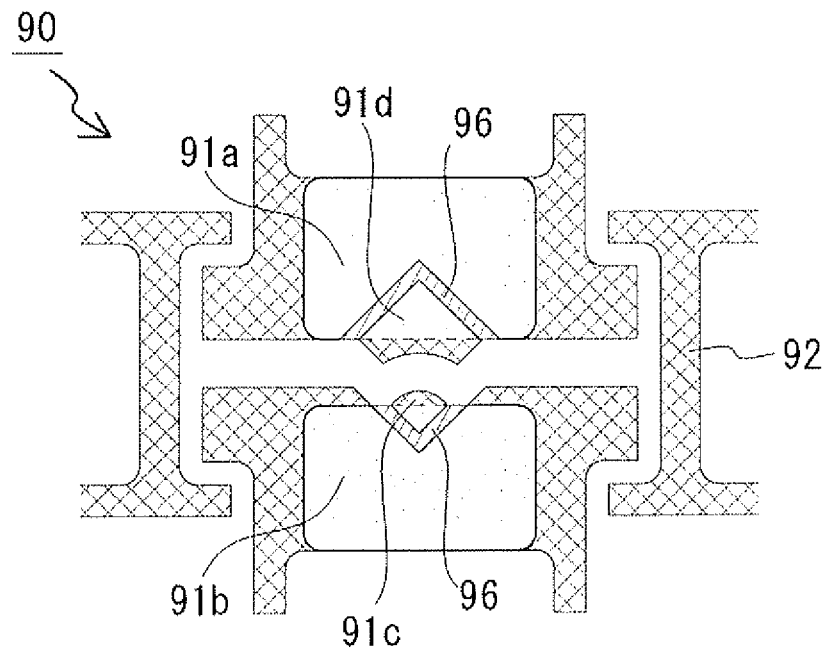
FIG. 9A is a plan view of a lead frame according to Embodiment 8 of the present invention.

The lead frame 90 of Embodiment 8 is for the lead frame of a semiconductor device (light emitting device), and the schematic for a single unit U of the lead frame for the light emitting device is shown in FIG. 9A. A plurality of single units U are arranged in a matrix, and in the single unit U, as shown in FIG. 9A, the shapes of the element mounting regions 91c, 91d of the lead portions 91a, 91b are demarcated by the grooves 96, respectively. The element mounting regions 91c, 91d respectively have a shape so that the diagonal lines of the light emitting element mounted thereon are substantially in parallel to the longitudinal direction and the direction perpendicular to the longitudinal direction in the matrix. In other words, the two opposite corners are at the end portion of the lead portion 91a. Accordingly, the grooves 96 are defined in an L-shape in the lead portions 91a, 91b, respectively.

Figure 9B:
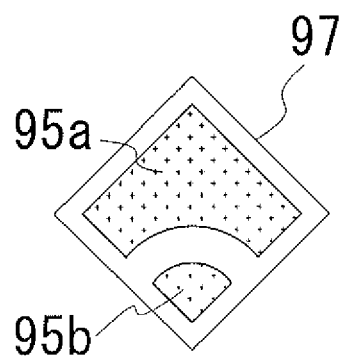
FIG. 9B is a plan view of a light emitting element showing an electrode pattern of a light emitting element to be mounted on the lead frame shown in FIG. 9A.

FIG. 9B is a top view of the light emitting element 97, in which a pair of positive and negative electrodes 95 for element are provided.

As shown in the figure, the light emitting element 97 has the n-electrode 95b having a ¼ circular shape centered at one of the corners of a quadrangular shape and the p-electrode 95a arranged spaced apart from the n-electrode 95b. The element mounting regions 91d, 91c of the lead frame 90 each has a shape corresponds to the pattern of the p-electrode 95a or the n-electrode 95b of the light emitting element shown in FIG. 9. That is, the element mounting region 91c of the lead portion 91b which corresponds to the n-electrode of the light emitting element has, in a top view, a circular arc projection at an end portion. The groove 96 is defined in an L-shape to surround the L-shape projection. The electrode mounting region 91c has a thickness greater at the inner side of the lead portion 91b, that is a side close to the groove, and smaller at the projected portion as the portion defining the groove 96.

The electrode mounting region 91d corresponding to the p-electrode of the light emitting element has, in a top view, a shape having a projection, an end portion thereof is recessed along the ¼ circular arc. The electrode mounting region 91d has a thickness greater at the inner side of the lead portion 91a, that is a side close to the groove, and smaller at the projected portion as the portion defining the groove 96. With such element mounting regions 91c, 91d, a half of the planar dimension (area) of the light emitting element, that is, with respect to a virtual diagonal line interconnecting two opposite corners, one half of the area is mounted on the region of the lead frame 90 having a greater thickness, and the other half area is mounted on the region having mostly a smaller thickness. The region with a smaller thickness in the element mounting regions 91c, 91d can be formed, for example, by etching the lead frame from its back-surface side. In this case, the lead frame 9 may have a stacked layer structure, but for example, may also have a single layer made of copper. The regions with smaller thicknesses may be expanded toward the groove 96 side compared to the projecting portion, as long as the element mounting regions 91e, 91d are not cut.

In the lead frame 90, support bars 92 are arranged at the both sides of the two lead portions 91a, 91b, so as to bridge from the lead portion 91a to the lead portion 91b.

Figure 9C:
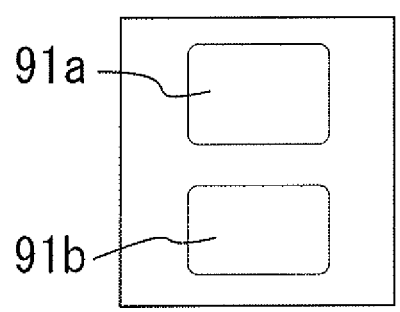
FIG. 9C is a diagram showing an exposed status of the lead frame on a back-surface in the case where the lead frame shown in FIG. 9A is used in a light emitting device.

The lead frame 90 includes in addition to the element mounting regions 91c, 91d, a portion partially etched from the back-surface side in the thickness direction in the outer periphery (shown by cross-hatching in the figure). With this arrangement, in the case where a resin member is applied on the lead frame 90 to fabricate the light emitting device, as shown in FIG. 9C, the lead portions 91a, 91b of the lead frame 90 are respectively exposed in an approximately quadrangular shape at the back-surface side of the light emitting device. With the use of the lead frame as described above, similar effects as in Embodiment 1 can be exerted.

INDUSTRIAL APPLICABILITY

The light emitting device according to the present invention can be applied to various kinds of light emitting devices such as illumination light sources, light sources for various kinds of indicators, light sources for automobile use, light sources for displays, back light sources for liquid crystal displays, light sources for sensors, signals, and so on. Also, the light emitting device is applicable to all the light emitting devices, such as so-called side-view type light emitting devices, which use a lead frame.

As illustrated above, embodiments are described to give a concrete form to technical ideas of a method of manufacturing light emitting element according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A lead frame comprising:
   a plurality of units connected together, each unit including
      a pair of lead portions connected to the pair of electrodes of a respective semiconductor element;
   each semiconductor element being mounted to a respective pair of lead portions;
   the lead portions of each pair of lead portions arranged spaced apart and opposite from each other, and configured to connect to the electrodes of a respective semiconductor element, the pair of lead portions being electrically separated from each other;
   each pair of lead portions including an element mounting region and a groove;
   the element mounting region arranged on a surface of the pair of lead portions and configured to mount a respective semiconductor element; and
   the groove extending from opposing end surfaces of each pair of lead portions in a direction away from the opposing end surfaces, the groove bending in a surrounding manner along an outer periphery of the element mounting region, and the groove being formed only on a surface of a corresponding one of the lead portions without penetrating through the corresponding one of the lead portions.

2. The lead frame according to claim 1, wherein:
   the groove includes a portion in a shape selected from a group of shapes including an L-shape, a T-shape, and a Cross shape.

3. The lead frame according to claim 1, wherein:
   the groove of one of the pair of lead portions is defined in a U-shape surrounding the element mounting region.

4. The lead frame according to claim 1, wherein:
   the groove of one of the pair of lead portions is defined in two or more separate grooves with respect to the element mounting region.

5. The lead frame according to claim 1, wherein:
the groove reaches an end surface between the pair of lead portions.

6. The lead frame according to claim 1, wherein:
the groove reaches a corresponding one of the opposing end surfaces of each pair of lead portions.

7. The lead frame according to claim 1, wherein:
the groove reaches an end surface of a lead portion tangent to a corresponding one of the opposing end surfaces of each pair of lead portions.

8. The lead frame according to claim 1, wherein:
the element mounting region defines, on its surface, a recess with one end reaching a corresponding one of the opposing end surfaces of each pair of lead portions.

9. The lead frame according to claim 1, wherein:
the lead frame is made of a clad material,
the clad material includes at least a first metal layer stacked on a second metal layer, and
the first metal layer and the second metal layer are different metals.

10. The lead frame according to claim 9, wherein:
the first metal layer has a linear expansion coefficient that is greater than the linear expansion coefficient of the second metal layer.

11. The lead frame according to claim 9, wherein:
the first metal layer has a greater solubility in an etching solution than the second metal layer.

12. The lead frame according to claim 11, wherein:
the etching solution is a solution of ferric chloride or copper chloride.

13. The lead frame according to claim 9, wherein:
a surface or a back-surface of the clad material is covered with a plated layer.

14. The lead frame according to claim 9, wherein:
the first metal layer is made of copper or a copper alloy, and
the second metal layer is made of iron or an iron alloy.

15. The lead frame according to claim 9, wherein:
the clad material is made of the first metal layer, the second metal layer, and a third metal layer, stacked in this order, and
the third metal layer is substantially the same metal as the first metal layer.

16. The lead frame according to claim 15, wherein:
the groove is defined in a two-layer structure of the first metal layer and the second metal layer.

17. The lead frame according to claim 1, wherein:
the lead portion further includes an inner groove in the groove, the inner groove substantially parallel to a side defining the groove.

18. A semiconductor device comprising:
a semiconductor element having a pair of electrodes on a same surface side;
a lead frame according to claim 1;
a resin member disposed between at the lead portions of at least one of the pairs of lead portions;
the resin member able to fix the lead frame and cover the groove defined in the lead frame.

19. The lead frame according to claim 1, wherein:
each semiconductor element is disposed bridging between the respective pair of lead portions.

* * * * *